United States Patent
Nishiguchi et al.

(10) Patent No.: US 8,163,659 B2
(45) Date of Patent: Apr. 24, 2012

(54) METHOD FOR OXIDE FILM FORMATION AND APPARATUS FOR THE METHOD

(75) Inventors: Tetsuya Nishiguchi, Numazu (JP); Naoto Kameda, Tsukuba (JP); Shigeru Saitou, Fuji (JP); Hidehiko Nonaka, Tsukuba (JP); Shingo Ichimura, Tsuchira (JP)

(73) Assignees: Meidensha Corporation, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 274 days.

(21) Appl. No.: 12/438,605

(22) PCT Filed: Aug. 22, 2007

(86) PCT No.: PCT/JP2007/066312
§ 371 (c)(1),
(2), (4) Date: Feb. 24, 2009

(87) PCT Pub. No.: WO2008/023748
PCT Pub. Date: Feb. 28, 2008

(65) Prior Publication Data
US 2010/0255684 A1  Oct. 7, 2010

(30) Foreign Application Priority Data
Aug. 25, 2006  (JP) .................................. 2006-229727

(51) Int. Cl.
*H01L 21/469* (2006.01)

(52) U.S. Cl. ................. 438/781; 257/E21.082; 438/789

(58) Field of Classification Search .................. 438/758, 438/765, 769, 770, 771, 772, 778, 780, 781, 438/787, 788, 789, 790, 795, 799, 784, 796; 257/E21.082, E21.282, E21.301
See application file for complete search history.

(56) References Cited

U.S. PATENT DOCUMENTS

| | | | | |
|---|---|---|---|---|
| 4,595,601 A | * | 6/1986 | Horioka et al. | ............... 438/695 |
| 4,842,891 A | * | 6/1989 | Miyazaki et al. | ............. 438/680 |
| 5,318,857 A | * | 6/1994 | Haluska | ......................... 428/552 |

(Continued)

FOREIGN PATENT DOCUMENTS

JP  4-180226 A  6/1992
(Continued)

OTHER PUBLICATIONS

Y. Nakata et al., "Low Temperature Gate Insulator for High Performance TFT-LCDs by Combination of Photo Oxidization and PECVD", Sharp Technical Report, vol. 80, No. 31 (2001), pp. 31-35.

(Continued)

*Primary Examiner* — William D Coleman
*Assistant Examiner* — Su Kim
(74) *Attorney, Agent, or Firm* — Foley & Lardner LLP

(57) ABSTRACT

In method and apparatus for oxide film formation, light in an ultraviolet light range is irradiated on a substrate, a starting gas of an organosilicon and an ozone gas are supplied to the substrate to form an oxide film on a surface of the substrate, and the ozone gas is mixed with the starting gas at room temperature and a mixture quantity of the ozone gas with the starting gas is set to be equal to a chemical equivalent or more necessary for totally oxidizing the starting gas.

12 Claims, 9 Drawing Sheets

U.S. PATENT DOCUMENTS

| | | | |
|---|---|---|---|
| 5,332,555 A | | 7/1994 | Hosokawa et al. |
| 5,462,899 A | * | 10/1995 | Ikeda ............................ 438/790 |
| 5,710,079 A | * | 1/1998 | Sukharev ....................... 438/778 |
| 5,876,798 A | * | 3/1999 | Vassiliev ................... 427/255.18 |
| 6,015,759 A | * | 1/2000 | Khan et al. .................... 438/707 |
| 6,030,460 A | * | 2/2000 | Sukharev ....................... 118/722 |
| 6,624,094 B2 | | 9/2003 | Toshikawa et al. |
| 7,772,133 B2 | * | 8/2010 | Nishiguchi et al. ............ 438/790 |
| 2001/0032781 A1 | * | 10/2001 | Fujii et al. ................. 204/192.11 |
| 2002/0028587 A1 | * | 3/2002 | Toshikawa et al. ........... 438/789 |
| 2004/0053472 A1 | | 3/2004 | Kiryu et al. |

FOREIGN PATENT DOCUMENTS

| | | |
|---|---|---|
| JP | 4-188622 A | 7/1992 |
| JP | 5-17164 B2 | 3/1993 |
| JP | 2001-274155 A | 10/2001 |
| JP | 2002-75988 A | 3/2002 |

OTHER PUBLICATIONS

Y. Nakata et al., "Low Temperature Oxidation using Photon or Plasma Excited Oxygen Atoms and its Application to Poly-Si Thin Film Transistor", Japan Vacuum Society magazine, vol. 47, No. 5 (2004), pp. 357-363.

Y.Z. Hu et al., "Real time investigation of nucleation and growth of silicon on silicon dioxide using silane and disilane in a rapid thermal processing system", J. Vac. Sci. Technol., vol. B14, No. 2 (1996), pp. 744-750.

A. M. Nguyen et al., "Properties of chemical vapor deposited tetraethylorthosilicate oxides: Correlation with deposition parameters, annealing, and hydrogen concentration", J. Vac. Sci. Technol., vol. B8, No. 3 (1990), pp. 533-539.

H. U. Kim et al., "Electrical Properties of Bulk Silicon Dioxide and Si'$O_2$/Si Interface Formed by Tetraethylorthosilicate-Ozone Chemical Vapor Deposition", Journal of The Electrochemical Society, vol. 147, No. 4 (2000), pp. 1473-1476.

T. Nishiguchi et al., "$SiO_2$ Dielectric Film Formation by Alternate Supply of Organic Silicon Gas and Highly Concentrated Ozone Gas at Below 300° C.", Jap. Vac. Soc., vol. 48, No. 5 (2005), pp. 313-316.

D. W. Moon et al., "Ultraviolet-ozone jet cleaning process of organic surface contamination layers", J. Vac. Sci. Technol., vol. A17, No. 1 (1999), pp. 150-154.

* cited by examiner

FIG.6A
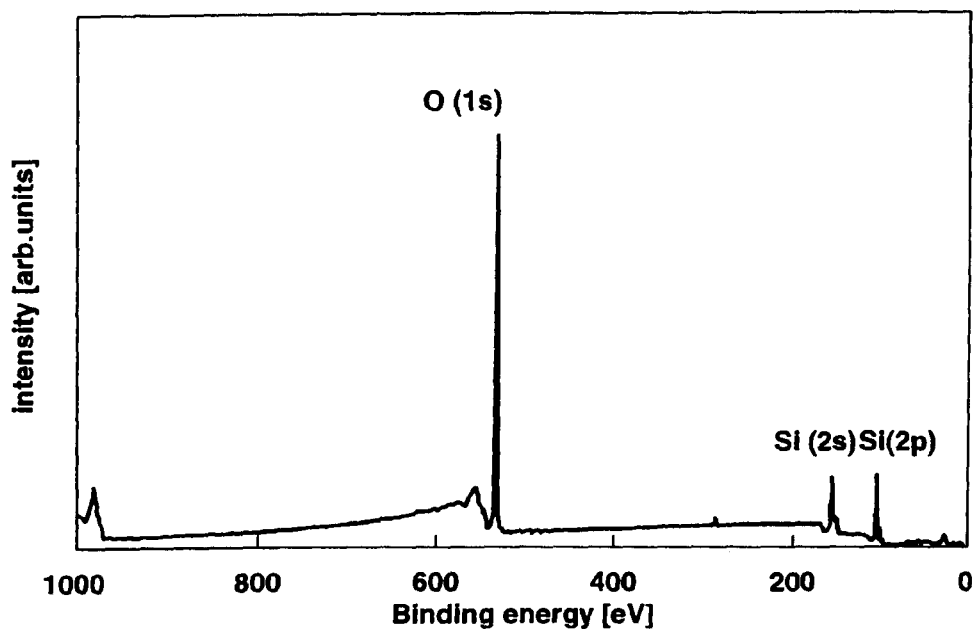
FIG.6B
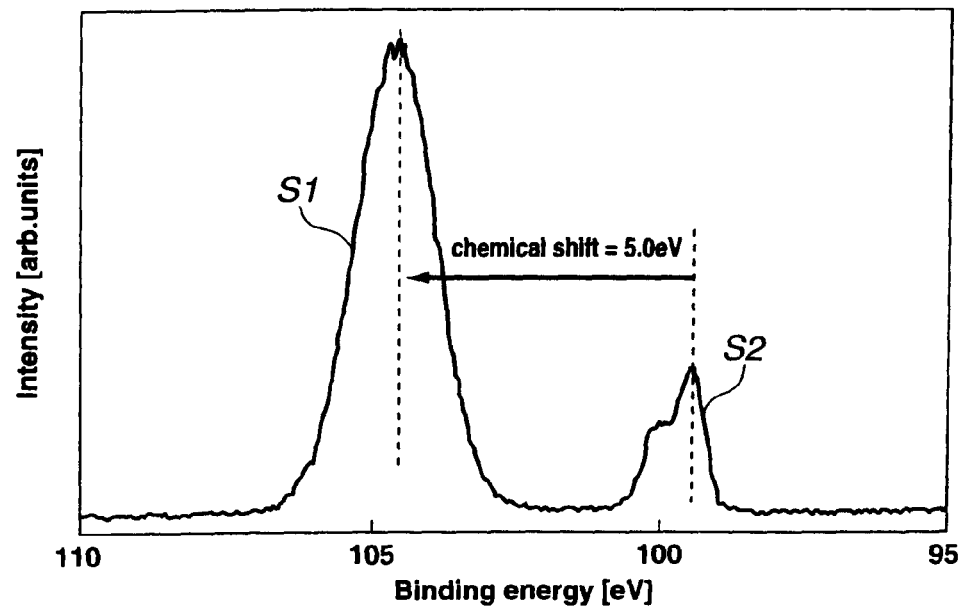
FIG.6C
| PROCESS | EMBODIMENT | COMPARATIVE EXAMPLE |
|---|---|---|
| TEMPERATURE [°C] | 200°C | 900°C |
| $I_{O(1s)}/I_{Si(2p)}$ | 5.7 | 5.6 |
| Chemical Shift of Si(2p) | 5.0 [eV] | 4.4 [eV] |

METHOD FOR OXIDE FILM FORMATION AND APPARATUS FOR THE METHOD

TECHNICAL FIELD

The present invention relates to a manufacturing method for a thin film transistor and its manufacturing apparatus therefor, the thin film transistor being used in an organic EL, a flexible display, or so forth.

BACKGROUND ART

Recently, an oxide film constituted by SiO₂ having a film thickness of about 50 through 100 nm installed in a thin film transistor on a glass or plastic substrate is mainly used in a liquid crystal display or a flexible display. In a case of the liquid crystal display, due to a restriction of a thermal durable temperature of an inexpensive glass substrate (for example, non-alkaline glass), a manufacturing process demands, under the current circumstance, about 300° C. or lower. On the other hand, in a case of the flexible display, it is general practice that a process (transcription method) in which the TFT device is once prepared on the glass substrate and transcribed onto the plastic substrate. Hence, similarly, the process of 300° C. or lower is demanded. In order to aim, hereafter, at a simplification of the manufacturing process, it is expected that a technique of preparing directly a silicon insulating film and an insulating film on the plastic substrate is needed. In this case, a process under 200° C. or lower heat durable temperature of a micromolecular film such as a polyethersulfone (PES) is demanded. A CVD using mainly plasma (PE-CVD: Plasma-Enhanced Chemical Vapor Deposition) has been used in a preparation of an insulating film at about 300° C. However, in order to apply this PE-CVD to the next generation technology, there are problems of requiring an improvement in an interface characteristic to a silicon-series thin film to make deviations in threshold voltages small, requiring an anneal process for about two hours at about 600° C. to make a characteristic improvement after the formation of the film, a difficulty in a thin-film formation for higher performance, increasing remarkably by one digit a carbon impurity concentration within a film with a film formation temperature reduced hereafter to 200° C. and so forth (non-patent document 1).

It is necessary for the next generation TFT to realize a transistor characteristic which has a lower threshold voltage with a high electron mobility and is stable as a device. This depends on how high-quality gate insulating film is achieved. Recently, a main aim has been placed on (1) in what way a plasma source of high-density and low-damage should be developed in the plasma CVD process: (2) a development in a formation technique of a gate insulating film which does not use plasma at all: and (3) a development of a technique of maintaining a clear interface with a silicon film which provides a substrate.

Then, from a viewpoint of (2), especially with a fact that the damage in the interface cannot be avoided taken into consideration, an apparatus to which a catalytic chemical vapor deposition method for the preparation of the gate insulating film has been applied has been developed. This apparatus is perfectly plasma-free and can correspond to a large area by arranging a high-melting point metallic converter on a large area and has a feature that a gas utilization efficiency is high and a usage quantity of gas can be suppressed (non-patent document 2).

In addition, from a standpoint of (3), if an SiO₂ deposition film prepared during the plasma CVD process is used in the gate insulating film, impurities on a silicon surface are directly introduced onto the interface. Hence, from the standpoint of large deviations of values of interface level densities, double-layer structured gate oxidation films have been prepared. First, the insulating film of a first layer is formed under the low temperature heat oxidation. A thermal oxidation rate is very low at a low temperature equal to or lower than 300° C. so that either a plasma-oxidation or a photo-oxidation using plasma or light has been used in place of heat. In order to secure a dielectric strength voltage and to realize a low leakage current, a second insulating layer (upper layer) is formed by means of a high-density, high-frequency plasma CVD method which does not give damage against the first layer oxidation film and against the interface. In a case where the oxidation film of the first layer is not used, the interface level density is $1 \times 10^{11}$ [cm²/eV]. However, if the photo-oxidation film of 2 nm is prepared, the interface level density is reduced to $4 \times 10^{10}$ [cm²/eV]. A treatment time for about 2 minutes is needed, in the case of the photo-oxidation film, for a ten-minute plasma oxidation at 300° C. to prepare the heat oxidation film of 2 nm. It is expected that it needs a further treatment time if both processes are carried out at 200° C. Hence, in a case where the double-layer structure is adopted, it is necessary to suppress a reduction in a throughput to a minimum limit.

On the other hand, a method of accumulating SiO₂ film in proximity to room temperature is disclosed by performing an ultraviolet photo irradiation using an Excimer Radiation System under O₂ atmosphere including a raw material gas of an organosilicon (patent document 1). According to this method, a binding energy of C—H, C—C, and so forth in most organic-series material gas such as TEOS (Tetraethoxysilane) is equal to or below 6 eV. Hence, the binding of the raw material gas can easily be broken at a normal temperature and an oxide film (SiO₂) having no thermal nor plasma damage can be formed.

It should be noted that, in a case where the formation of SiO₂ film onto the silicon thin film on the plastic or glass substrate is applied, an irradiation of ultraviolet light is carried out toward the substrate. Thus, photons not absorbed in a gaseous phase are irradiated onto a substrate material over the silicon thin film. For example, OA-10 (manufactured by Nippon Electric Glass) which is a representative low-temperature polysilicon thin film transistor substrate has a light absorption having a shorter wavelength than 250 nm. Hence, a light damage is introduced to the substrate. Then, there is a possibility that a problem of a reduction in a tight attachment between the substrate and the silicon thin film due to the light irradiation is generated. This can be applied equally well to the plastic whose absorption for ultraviolet light is larger than the glass and whose light degradation is severer than the glass.

The application of TEOS ozone CVD technique in which a preparation of an inter-layer insulating film which is bond-free and has a favorable step coverage to the thin film transistor insulating film has been discussed. However, it is under the present situation that a sufficient film formation speed is not obtained at a process temperature of 300° C. or lower and it lacks in practicality (non-patent document 4). This may because a reactivity of ozone molecules is reduced at a temperature of 300° C. or lower, namely, a reaction probability of decomposition reaction from ozone to a generation of oxygen atoms shown in a reaction equation described below is reduced so that ozone cannot function as a decomposition agent or an oxidation agent of TEOS.

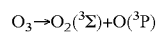

As far as a film quality is concerned, it is reported that hydrogen and carbon are left in the film as impurities in the same way as the film formed by the plasma CVD at 300° C. or lower so that the film becomes porous and provides a film whose etch resistance has been degraded and whose relative permittivity is reduced from an ideal value (3.9) and having an insulating characteristic of large leakage current (non-patent document 5 and non-patent document 6)

Non-patent document 1: Sharp technical report, by Yukihiko Nakata et al, 80, 31 (2001).
Non-patent document 2: "Applied physics" vol. 73, No. 7, pp. 0935-0938 (2004) by Ozono Shuji et al.
Non-patent document 3: "Vacuum" of Japan Vacuum Society magazine, 47, 5, pp. 357 (2004) by Yukihiko Nakata et al
Patent document 1: Japanese Patent Application First Publication No. 2001-274155.
Non-patent document 4: Shareef et al., J. Vac. Sci. Techol. B14, 744 (1996).
Non-patent document 5: A. M. Nguyen, J. Vac. Sci. Technol. B8533 (1999).
Non-patent document 6: H. U. Kim, and S. W. Rhee, J. Electrochem. Soc. 147 (2000)1473.

DISCLOSURE OF THE INVENTION

It is, in view of the above-described circumstances, an object of the present invention to provide oxide film formation method and oxide film formation apparatus which can form oxide film uniformly and at a high speed on a substrate at 200° C. or lower, the oxide film having a favorable characteristic as an insulating film.

Then, in the oxide film formation method of claim 1, the method comprises: irradiating light in an ultraviolet light range on a substrate; and supplying a starting gas of an organosilicon and an ozone gas to the substrate to form an oxide film on a surface of the substrate, wherein the ozone gas is mixed with the starting gas at room temperature and a mixture quantity of the ozone gas with the starting gas is set to be equal to a chemical equivalent or more necessary for totally oxidizing the starting gas.

In the oxide film formation method of the claim 2, according to the method for oxide film formation as claimed in claim 1, the light having a wavelength longer than 210 nm is irradiated on the substrate in a form of the light of the ultraviolet light range. In the oxide film formation method according to the claim 3, in the method for oxide film formation as claimed in claim 1, in a process in which oxide film formation is started, a supply of the starting gas is delayed at a time later than a supply of the ozone gas.

In the oxide film formation method of the claim 4, according to the method for oxide film formation as claimed in claim 3, in a process in which oxide film formation is ended, a stop of the supply of the starting gas is made before a stop of the supply of the ozone gas.

In the oxide film formation method of the claim 5, according to the method for oxide film formation as claimed in claim 3, in a process in which the supply of the organosilicon material is made, an intensity of light in the ultraviolet light range is reduced.

In the oxide film formation method of the claim 6, according to the method for oxide film formation as claimed in claim 1, light in the ultraviolet light range is irradiated onto the substrate via a gas layer through which an inert gas is circulated.

In an oxide film formation apparatus of the claim 7, an apparatus for oxide film formation in which light in an ultraviolet light range is irradiated on a substrate; and a starting gas of an organosilicon and an ozone gas are supplied to the substrate to form an oxide film on a surface of the substrate comprises: a treatment furnace in which the substrate is stored and light in the ultraviolet light range is introduced; and a pipe arrangement in which the ozone gas is mixed with the starting gas at room temperature and a mixture quantity of the ozone gas with the starting gas is set to be equal to a chemical equivalent or more necessary for totally oxidizing the starting gas.

In the oxide film formation apparatus according to the claim 8, according to the apparatus for oxide film formation as claimed in claim 7, light having a wavelength longer than 210 nm is irradiated onto the substrate in a form of light of the ultraviolet light range.

In the oxide film formation apparatus according to the claim 9, according to in the apparatus for oxide film formation as claimed in claim 7, in a process in which oxide film formation is started, a supply of the starting gas is delayed at a time later than a supply of the ozone gas.

In the oxide film formation apparatus according to the claim 10, in the apparatus for forming the oxide film as claimed in claim 9, in a process in which oxide film formation is ended, a stop of the supply of the starting gas is made before a stop of the supply of the ozone gas.

In the oxide film formation apparatus according to the claim 11, in the apparatus for oxide film formation as claimed in claim 9, in a process in which the supply of the organosilicon material is made, an intensity of light in the ultraviolet light range is controllably reduced.

In the film formation apparatus according to the claim 12, in the apparatus for oxide film formation as claimed in claim 7, the treatment furnace is provided with a light introducing section configured to introduce light in the ultraviolet light range, a gas layer through which an inert gas is circulated is interposed between the light introducing section and the treatment furnace, and light in the ultraviolet light range is irradiated onto the substrate via the gas layer.

According to the invention described above, the utilization efficiency of the starting gas is increased and the oxide film whose electric characteristic is superior in the film formation process at a temperature equal to or below 200° C. can be formed.

BRIEF DESCRIPTION OF THE DRAWINGS

FIGS. 6A, 6B, and 6C are an XPS spectrum (a) representing signals of O(1s), Si(2s), and Si(2p), an XPS spectrum (b) representing a signal Si from signal Si within a photo CVD film and a signal S2 from a silicon substrate of groundwork, and a comparison table (c) of a signal intensity ratio ($I_{O(1s)}/I_{Si(2p)}$) between O($1s$) and Si($2p$) and a chemical shift quantity of Si ($2p$) in a CVD process (temperature condition 200° C.) according to gas mixture of HMDS gas and ozone gas and the ultraviolet light in this embodiment according to the present invention and in a thermal oxidation process (temperature condition 900° C.) related to a comparative example, respectively.

BEST MODE FOR CARRYING OUT OF THE INVENTION

Figure 1:
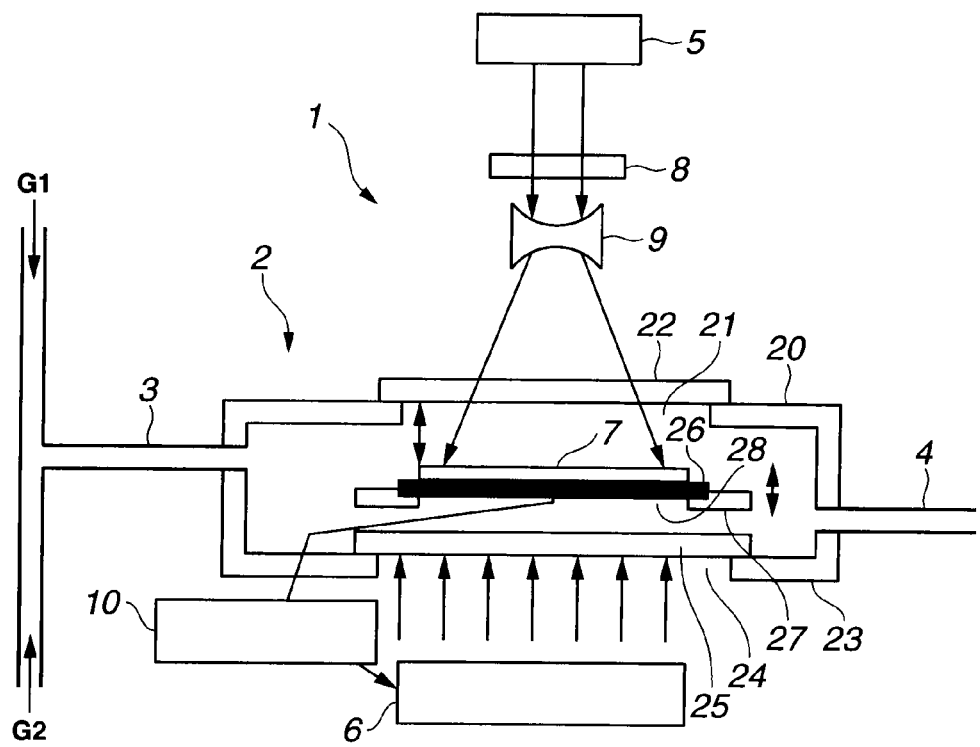
FIG. 1 is a rough configuration view of an oxide film formation apparatus related to a first preferred embodiment.

It was preliminarily verified that it was possible to form oxide film under 200° C. in the CVD process using an ozone gas and a raw material gas constituted by an organosilicon (hereinafter, referred simply as a starting gas) when the present invention was created. An ordinary low-pressure CVD furnace was adopted as a treatment furnace used for this verification. The ozone gas was supplied and exhausted in order for a direction of gas flow after a starting gas premixed to be in parallel to a surface of Si substrate. The ozone gas generated by an ozone generation system (MPOG-31002) manufactured by Meidensha was used as ozone gas. As the starting gas, several kinds of organosilicon gases (hexamethyldisilazane, tetraethoxysilane, and tetramethylsilan) were used as comparison experiments. According to evaluations through a mass analyzer (manufactured by ANELVA, M-066), it was clarified that the starting gas was analyzed up to an intermediate product (molecules having small numbers of molecules in which only weak bonds in the starting gas are broken, for example, SiO or so forth) instantaneously while the starting gas was circulated through a pipe arrangement at room temperature after the starting gas was mixed with the ozone gas and the intermediate product was not reacted any more with excessive ozone gas at room temperature and could be supplied stably in the state ("Vacuum" 48(5), 313 (2005) in Japan Vacuum Society paper magazine by Nishiguchi et al.).

It was appreciated that the intermediate product was reacted with the ozone gas under an environment of gas temperature equal to or higher than 200° C. and $SiO_2$ was accumulated on the substrate. It was also appreciated that, with the ozone in a gas phase was thermally decomposed through a transition thereof toward the downstream side, the reaction between the ozone and the intermediate product causes both gasses to be reduced as both gases are transferred toward the downstream side and a necessity of a preliminary heating due to a necessity of an finite time from a production of the intermediate product and to the accumulation. To achieve an uniform treatment of a large-sized substrate, it was appreciated that it was necessary to optimize process parameters including a structure of the apparatus (primary heating, substrate rotation mechanism, and so forth) such as a gas flow speed, gas temperature (treatment temperature), and a ratio between the starting gas and the ozone gas flow quantity (Tokushima university, Autumn No. 66 Applied Physics Society Related Union Lecture authored by Kamata et al.). In addition, it was appreciated that a film quality of accumulation film (such as an interface level density, a relative permittivity, an etch resistance, and so forth) has a distribution corresponding to a film thickness distribution.

According to the oxide film formation method and apparatus in the case of the present invention, the improvement in the film formation speed, the improvement in the film quality of the CVD film including the cleaning of the interface, and the uniform treatment when a large-sized substrate is treated are, simultaneously, achieved. Specifically, light in the ultraviolet light range, viz., light having brilliant lines longer than 210 nm not inducing a light damage (hereinafter, ultraviolet light) is irradiated on the substrate under a mixture atmosphere of the starting gas and the ozone gas so that a high-quality oxide film of $SiO_2$ can be formed at a high speed.

Hereinafter, preferred embodiments of the present invention will be described.

First Embodiment

FIG. 1 is a rough configuration view of an oxide film formation apparatus related to a first preferred embodiment according to the present invention.

Oxide film formation apparatus 1 includes: a treatment furnace 2; pipe arrangements 3, 4; and light sources 5, 6. Treatment furnace 2 is a furnace of a lateral laminar flow low-pressure type. Treatment furnace 2 stores a substrate 7 on which oxide film is formed.

In pipe arrangement 3, a starting gas G1 is mixed with an ozone gas G2 at room temperature. A mixture quantity of the ozone gas with the staring gas is set to a chemical equivalent, for example, twice or more chemical equivalents necessary for totally oxidizing the starting gas. In addition, a residence time of a gas mixture including starting gas G1 and ozone gas G2 is set to secure a time longer than a reaction time of both gases G1 and G2. On the other hand, pipe arrangement 4 is a pipe arrangement to exhaust gas within treatment furnace 2. One end of pipe arrangement 4 is connected to a suction pump (not shown) to suck the gas mixture.

A light source having brilliant lines of continuous or discrete wave lengths equal to or longer than a wave length of 210 nm is adopted as light source 5. An UV lamp manufactured by Usio Electric is illustrated as this light source (DEEP-UV lamp, lamp output of 2000 W). The above-described light is irradiated vertically to the flow of gas directed toward substrate 7. A luminance of light is adjusted for a fluctuation of the luminance on the whole surface of substrate 7 to become smaller in accordance with a uniformity of a treatment surface required for substrate 7. In addition, in accordance with respective purposes such as when an oxide film is formed on an interface of substrate 7, when, using a CVD method with a combination use of the ozone gas, the film is formed, and when a surface reformation of substrate 7 is carried out, an application voltage to light source 5 is controlled so that the luminance of light is adjusted or an optical element is equipped in light source 5 by which a spectrum of light is adjusted.

On the other hand, an opening 21 to introduce light irradiated from light source 5 is formed on a ceiling 20 of treatment furnace 2. A light introduction plate 22 to introduce the light irradiated from light source 5 is installed to close opening 21. In addition, an optical filter 8 and a biconcave lens 9 are interposed between light source 5 and light introduction plate 22.

Furthermore, an opening 24 to introduce light irradiated from light source 6 on ceiling 20 of treatment furnace 2 is formed on a bottom section 23 of treatment furnace 2. A light source introduction plate 25 to introduce light irradiated from light source 6 is installed to close opening 24. A halogen lamp is illustrated which is a light source to heat substrate 7. Light introduction plates 22, 25 are formed with materials, each thereof having a heat durability and a light transmissibility illustrated as a synthetic quartz. Each of diameters of openings 21, 25 are set at least to be larger than a maximum outer diameter of substrate 7.

Substrate 7 is held by a susceptor 26 constituted by a material having the heat durability illustrated in ceramics. Susceptor 26 is movable in an upward- or -downward direction of treatment furnace 2 transmitted to thermocouple 10 by means of a stage 27. An opening 28 is formed in order for light irradiated from light source 6 through light introduction plate 25 of treatment furnace 2 to be fed to susceptor 26. On the other hand, a thermocouple 10 is connected to susceptor 26. Light source 6 controls the light luminance on a basis of a heat of susceptor 26 transmitted to thermocouple 10 and controls a temperature of susceptor 26 which heats substrate 7.

The starting gas and the ozone gas are mixed in a gas phase within pipe arrangement 3 before introduction of the gases into treatment furnace 2. The mixture of organosilicon gas and ozone gas are held at room temperature and circulated for one hour (for example, 1 second) within pipe arrangement 3 irrespective of the ozone concentration. At this time, as shown in the characteristic graph of FIG. 2, a substantially stable intermediate state (a state wherein Si—O or in a state where atoms on which an atom other than oxygen atoms is adhered) and bi-products such as methanol, ethanol, acetaldehyde, oxide carbon, dioxide carbon, and so forth are generated in a gaseous phase.

Figure 2:
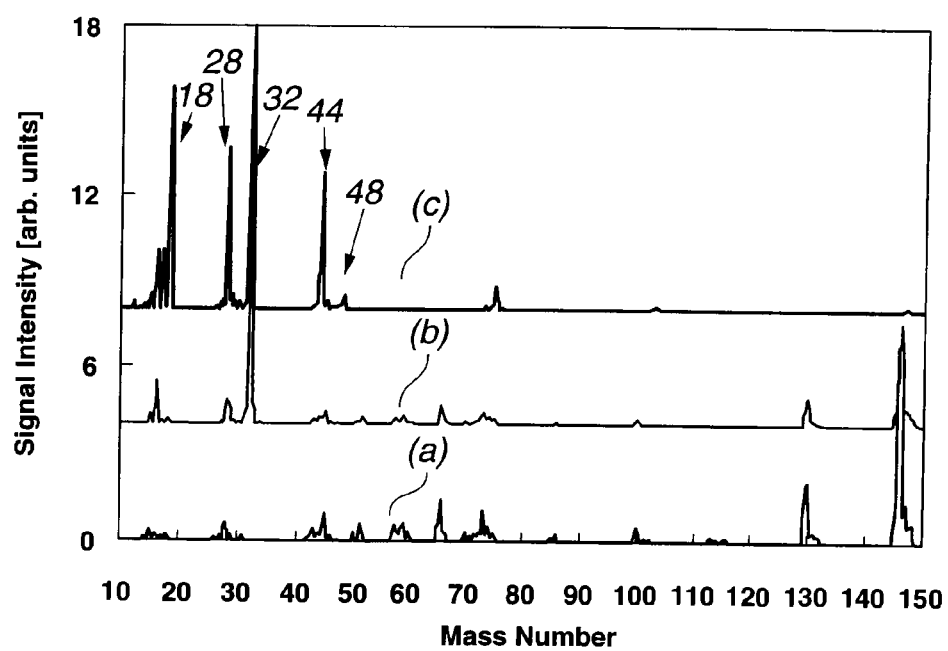
FIG. 2 is a characteristic graph representing a mass composition of a product in cases where (a) only HMDS gas is supplied at room temperature, (b) oxygen is mixed with HMDS gas at a ratio of HMDS gas:oxygen (100%)=1:9 at room temperature, and (c) ozone is mixed with HMDS gas at room temperature at a ratio of HMDS gas:ozone (100%)=1:9.

FIG. 2 shows a characteristic graph representing a mass composition of products in a case where only HMDS gas is supplied at room temperature, in a case (b) where oxygen is mixed with HMDS gas at a ratio of HMDS gas:oxygen (100%) gas at room temperature=1:9, and in a case (c) where the ozone is mixed with HMDS gas at room temperature at a ratio of HMDS gas:ozone (100%)=1:9.

Excessive ozone, intermediate products, and bi-products are transported within the furnace with no more progress of the organosilicon gas even if excessive ozone is present (for example, refer to a stable gas composition spectrum after the mixture in a case where HMDS (hexamethyldisilazane) shown in FIG. 2) is used as the starting gas.

In order to realize a state in which the ozone gas is excessively present even in treatment furnace 2, a flow quantity of the ozone gas is needed to be equal to or larger than the flow quantity necessary for a complete decomposition of the starting gas by means of the ozone. For example, in a case where TMS (tetraethylsilane) is used as the starting gas, ozone molecule is needed having a flow quantity 16 times or more of a substrate (TMS) as expected from the following chemical reaction equation. It should, however, be noted that it is desirable to realize a flow quantity ratio equal to or twice this flow quantity ratio, with a loss due to a heat decomposition of ozone taken into consideration.

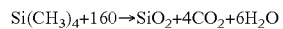

Ultraviolet light is irradiated toward substrate 7 crossing over window (light introduction plate 22) through which light is transmitted as shown in FIG. 1. The irradiation of ultraviolet light (UV) is carried out simultaneously together with the supply of the starting gas and the ozone gas at a start of the process and is stopped at the end of the supply of the starting gas and the ozone gas. An intensity distribution of the luminance of ultraviolet light is in accordance with an allowance fluctuation in film thickness of the required film formation and an allowable range of the intensity distribution is determined. However, in order to realize an uniform process of, for example, ±10%, the intensity distribution within the surface of the substrate within ±10% may be realized. In addition, a wavelength of light irradiated from light source 5 may be limited to the wavelength longer than 210 nm, with no induction of a light damage onto the substrate taken into consideration. However, if the luminance of light having the wavelength falling between 210 nm and 300 nm is equal to or larger than 50 mW/cm², a luminance distribution is not limited.

A more minute film can be accumulated as the luminance of light from light source 5 becomes higher and an improvement in the film quality starting from an etch durability can be achieved. It was confirmed that an effect of generating excited state oxygen atoms through an ozone photo absorption reaction, as experimentally shown in the following reaction equations and reacting this excited state oxygen atoms with intermediate products in a gases phase and an arrival of light on the surface of substrate 7 to make a selective heat of treated surface number several nm through 10 nm of substrate 7 and to promote a surface reaction of substrate 7 contributes on the improvements in the film formation speed and film quality.

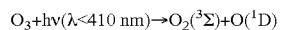

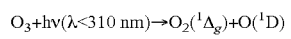

A pressure within treatment furnace 2 may be reduced as low as possible in order to make arrivals of photons onto the substrate as large as possible, namely, to realize a rise in the surface temperature of a silicon thin film and to achieve a promotion of an accompanied surface reaction. It should be noted that the pressure of treatment furnace 2 may be set to a range from 10 Pa to 300 Pa, more especially from 10 Pa to 200 Pa which is a process pressure of an ordinary low-pressure CVD.

An industrial ozone generation apparatus having a concentration of 10~20 vol % caused by a discharge or so forth may be used as an ozone gas generation source. However, if oxygen gas is co-existent in an optical irradiation range within treatment furnace 2, the generated excite state atoms (O(¹D)) is reacted with oxygen atoms resided in a surrounding section in the following reaction (reaction speed constant: k=3.2×

$10^{-11}$ exp(67/T), T denotes a gas temperature) and is deactivated so that a reactivity to organic substances is reduced and the effect of the irradiation of ultraviolet light is reduced.

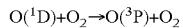

Hence, the ozone gas having a concentration as high as possible, for example, the ozone gas of approximately 100% concentration may be used which is introduced in a Japanese Patent Application Second Publication No. Heisei 5-17164.

The introduction method of starting gas can be used when the gas of a low vapor pressure is introduced into a conventional MOCVD and so forth. It should be noted that, in a case where, due to the same reason as described above, the starting gas is introduced together with a distilled gas, using a gas having a slow reaction such that the excited state oxygen atoms are deactivated to ground state oxygen atoms (for example, an inert gas of Ar or He), the starting gas may be introduced and be distilled. In addition, as described in each of second through fourth embodiments which will be described hereinafter, the supply of the starting gas for only a constant time during the start or end of the process is stopped according to its necessity. In response to an introduction of only ozone gas and an irradiation of ultraviolet light, an interface thermal oxidation of an ozone light CVD film and a surface reformation may be carried out.

Next, an example of film formation in the process of the first embodiment will be described below.

After the ozone gas (concentration 90 vol % or higher) having a high purity supplied from ozone generation equipment (MPOG-31002) manufactured by Meidensha and the starting gas of HMDS (hexamethyldisilazane) gas (no carrier gas) of, 100 sccm and 0.5 sccm, respectively, were passed into pipe arrangement 3 which was controlled at room temperature and, thereafter, mixed together evenly at a position near by 30 cm of treatment furnace 2. Gas was supplied so as to be laminar flow from a side surface in treatment furnace 2. Light of UV lamp (DEEP-UV lamp, lamp output of 2000 W) manufactured by USHIO INC. irradiated as light of light source 5 in order for a gas phase travel distance (a distance from light introduction plate 23 to substrate 7) crossing over light introduction plate 22 made of a synthetic quartz glass from an upper part of treatment furnace 2 to indicate 15 mm. The luminance was set to 100 mW/cm$^2$ on an upper surface of a quartz glass plate (the wavelength was 210 nm through 300 nm and it should be noted that the luminance will, hereinafter, be defined in this range). The pressure of treatment furnace 2 was indicated as 130 Pa by exhausting gas through treatment furnace 2 with a dry pump. Substrate 7 had a hydrogen terminated Si (100) surface which was supplied to the formation of oxide film.

Figure 4:
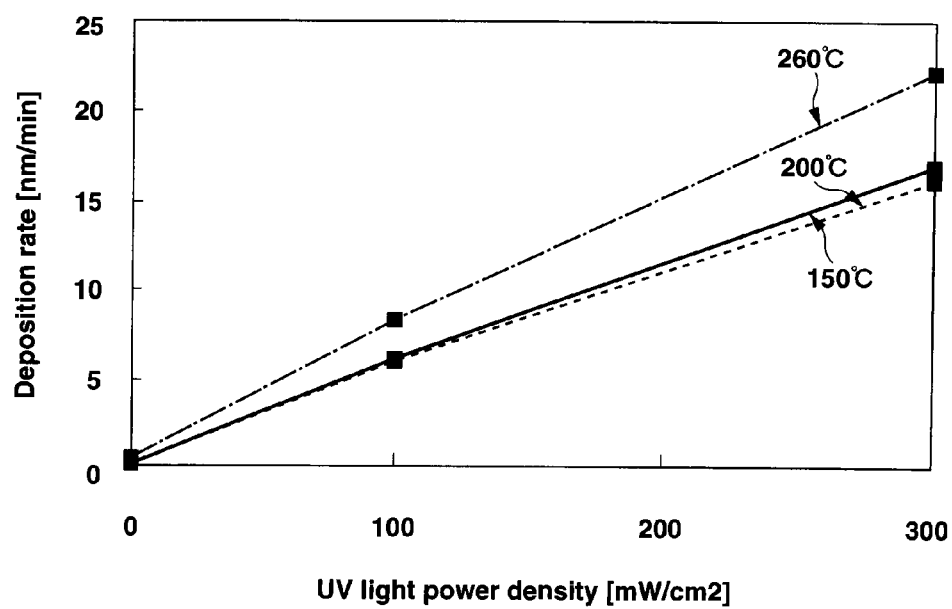
FIG. 4 is a characteristic graph representing a relationship between a luminance of the ultraviolet light and film formation speeds in a case where the film formation is carried out at film formation temperatures of 260° C., 200° C., and 150° C.
Figure 5:
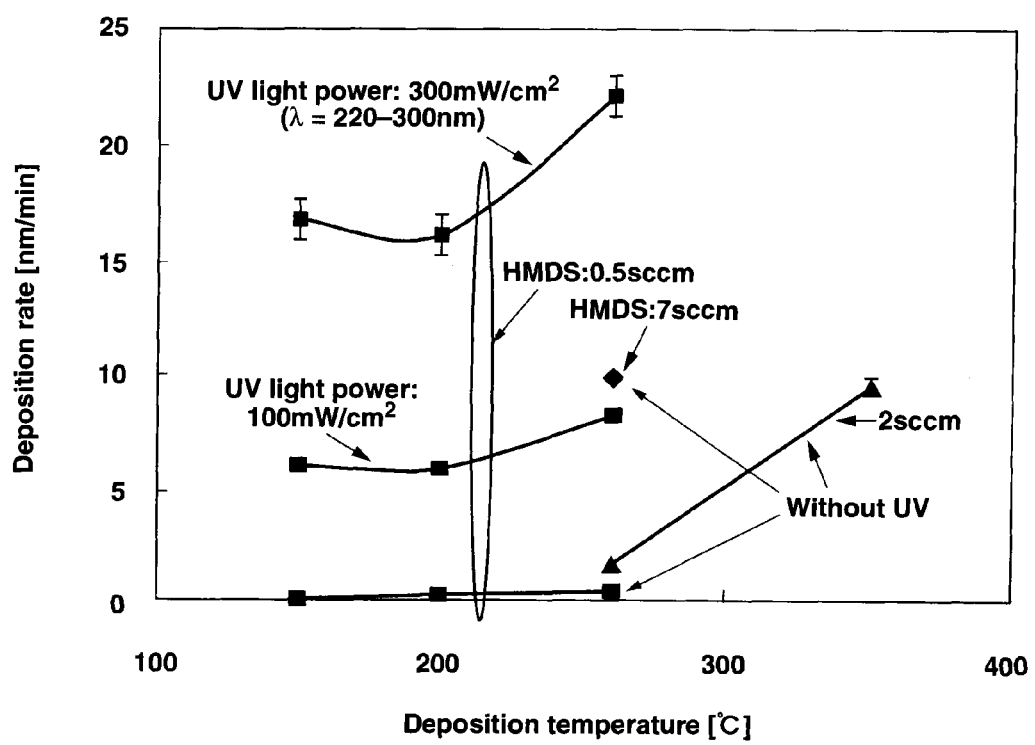
FIG. 5 is a characteristic graph representing differences of the film formation speeds depending upon a presence or absence of an irradiation of ultraviolet light.

FIG. 4 shows a characteristic graph representing a relationship between a luminance of ultraviolet light and the film formation speed in a case where the film formation is carried out at film formation temperatures of 260° C., 200° C., and 150° C. FIG. 5 shows a characteristic graph representing a difference between film formation speed depending upon a presence or absence of the irradiation of the ultra-violet light. According to these characteristic graphs, it can be verified that the film formation speed of oxide film of substrate 7 hardly advances any more at 200° C. in a case where the irradiation of light is not carried out and, as compared with a fact that a treatment temperature dependency of the film formation speed is large, the film formation speed is 7 through 8 nm/min not depending upon temperature at 200° C. through 260° C. In addition, it was verified that, when the luminance was raised up to or higher than 300 mW/cm$^2$, the film formation speed indicated 20 nm/min or higher so that the film formation speed equal to or higher than each of atmospheric pressure, high temperature thermal CVD or plasma CVD was obtained.

FIG. 6A shows an XPS spectrum representing signals of O(1$s$), Si(2$s$), and Si(2$p$). FIG. 6B shows an XPS spectrum representing a signal Si from Si in a photo CVD film and a signal S2 from the ground silicon substrate. FIG. 6C shows a comparison table of a signal intensity ratio (IO(1$s$)/ISi(2$p$)) between O(1$s$) and Si(2$p$) in the CVD process (temperature condition was 200° C.) according to the gas mixture of HMDS gas and the ozone gas and ultraviolet light related to the first embodiment according to the present invention and the signal intensity ratio (IO(1$s$)/ISi(2$p$)) between O(1$s$) and Si(2$p$) and a chemical shift quantity of Si(2$p$) in a thermal oxidation process (temperature condition was 900° C.) related to a comparative example.

When the film quality of oxide film was investigated through an X-ray photo-electron spectroscope and an infrared absorption spectrum of the accumulation film, it was confirmed that oxide film was a silicon oxide film of stoichiometric (Si: O=1:2) as shown in FIG. 6A. It was appreciated from the XPS spectrum of the photo CVD film (10 nm), the chemical shift quantity, and the signal intensity ratio of Si(1$s$) and O(2$p$) shown in FIGS. 6B and 6C that Si was also charged to four valencies at stoichiometric (Si: O=1:2) of the oxide film. It is, especially, appreciated from the comparison table shown in FIG. 6C that the CVD process related to the present invention indicates an energy efficiency higher than the thermal oxidation process related to the comparative example.

Figure 7:
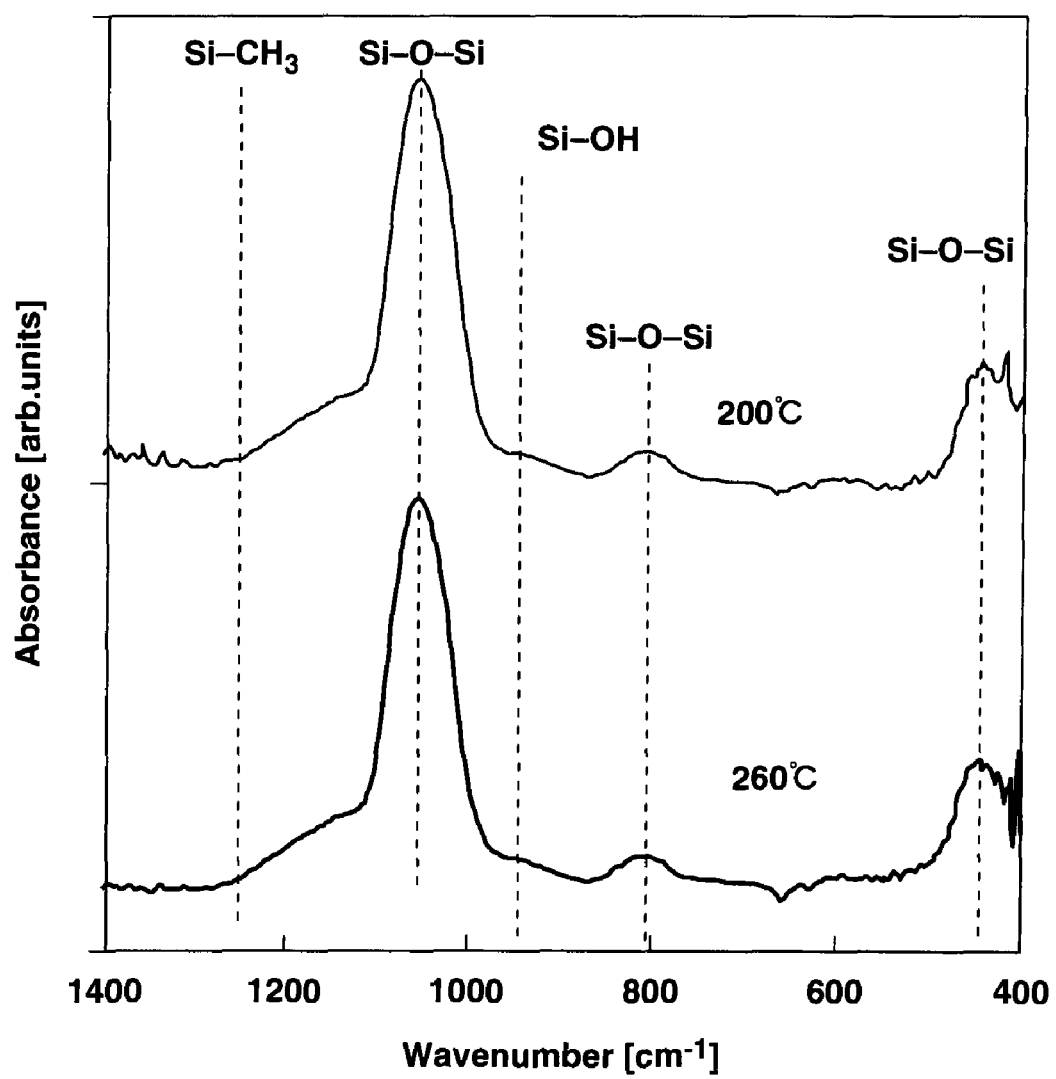
FIG. 7 is an infrared absorbance spectrum of an accumulation film.
Figure 8:
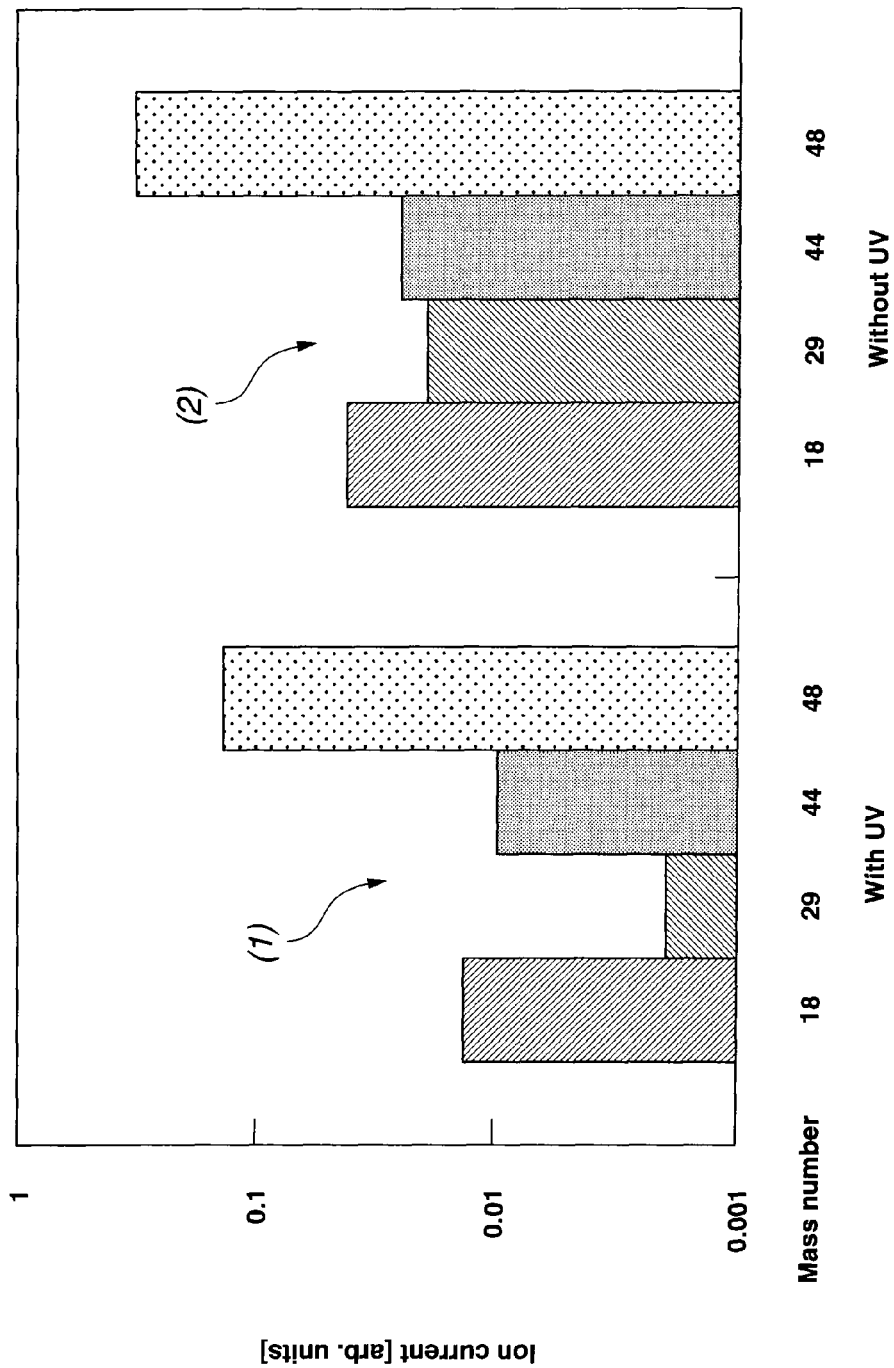
FIG. 8 is a mass spectrum representing a result of mass analysis of a reaction bi-product in a case (1) where HMDS gas flow quantity is 0.5 sccm under the irradiation of ultraviolet light having a light intensity of 300 mW/cm² and in a case (2) where HMDS gas flow quantity is 2 sccm without the irradiation of ultraviolet light.

In addition, as appreciated from the characteristic graph of FIG. 7, it was confirmed that a quantity of Si—C bond or Si—OH bond in the oxide film was 1 wt % or below since an absorption corresponding to a remaining of the carbon and hydrogen in the accumulation film cannot be confirmed. Peak signal positions are the same as those of a thermal oxide film. It was confirmed that the relative permittivity of oxide film approached to the ideal value of 3.9 by the irradiation of light. In a case where the luminance was 300 mW/cm$^2$, oxide film having the etch resistance up to ¼ the thermal oxide film could be obtained immediately after the accumulation. As far as a film thickness distribution was concerned, an accumulation film thickness distribution within ±10% could be achieved by making a luminance distribution on the surface of substrate 7 uniform within ±10%.

It was confirmed that differences in the film formation speed of the oxide film and in the film quality thereof in a case of the light irradiation and in a case of no light irradiation do not occur due to the light absorption of intermediate products produced when HMDS gas and the ozone gas were mixed together on a ground that a rise in pressure when ultraviolet light was irradiated under an atmosphere of only ozone partial pressure was the same as the rise in pressure when the same ultraviolet light was irradiated under a mixture atmosphere of the ozone gas and HDMS gas. That is to say, as shown in FIG. 4, the film formation speed is proportional linearly to the light luminance. It can, thus, be concluded that the oxygen atoms in the excited state generated in proportion to the light luminance are a main cause.

In the conventional art, the HMDS gas flow quantity of 7 sccm was needed to obtain the film formation speed of 10 nm/min at 200° C. as shown in the characteristic graph in FIG. 5, for example, in a case of HMDS even if the flow quantity of organosilicon starting gas was decreased.

On the other hand, according to the film formation process of oxide film in this embodiment, HMDS gas flow quantity can be reduced to 0.5 sccm in a combination use of ultraviolet light having the luminance equal to or higher than 100 mW/cm$^2$. Consequently, as appreciated from a comparison between a mass spectrum of (1) (a case where HMDS gas flow quantity was set to 0.5 sccm under the irradiation of ultraviolet light having the luminance of 300 mW/cm$^2$) and a mass spectrum of (2) (a case where HMDS gas flow quantity was set to 2 sccm with no irradiation of ultraviolet light), a quantity of reaction bi-products (alcohol series or aldehyde series expressed, for example, by $H_2O$ (mass number 18), $CO_2$ (mass number 44), and mass number 29) can be reduced. Hence, a load of the film formation process into a gas treatment system is reduced. Thus, a frequency of a cleaning of the treatment furnace (including an optical window) for the above-described gas treatment system and a frequency of maintenance of a pump can be reduced.

Figure 9:
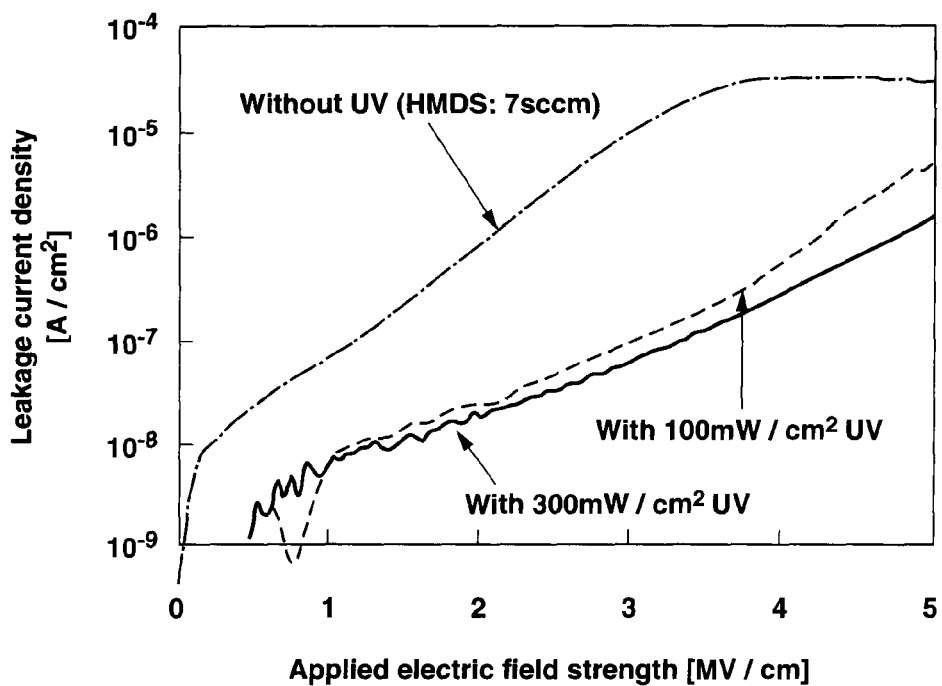
FIG. 9 is a characteristic graph representing insulation characteristics of the oxide film formed with a combined use of ultraviolet light having luminance of 100 mW/cm² and luminance of 300 mW/cm² and of oxide film formed with no combined use of ultraviolet light.
Figure 10:
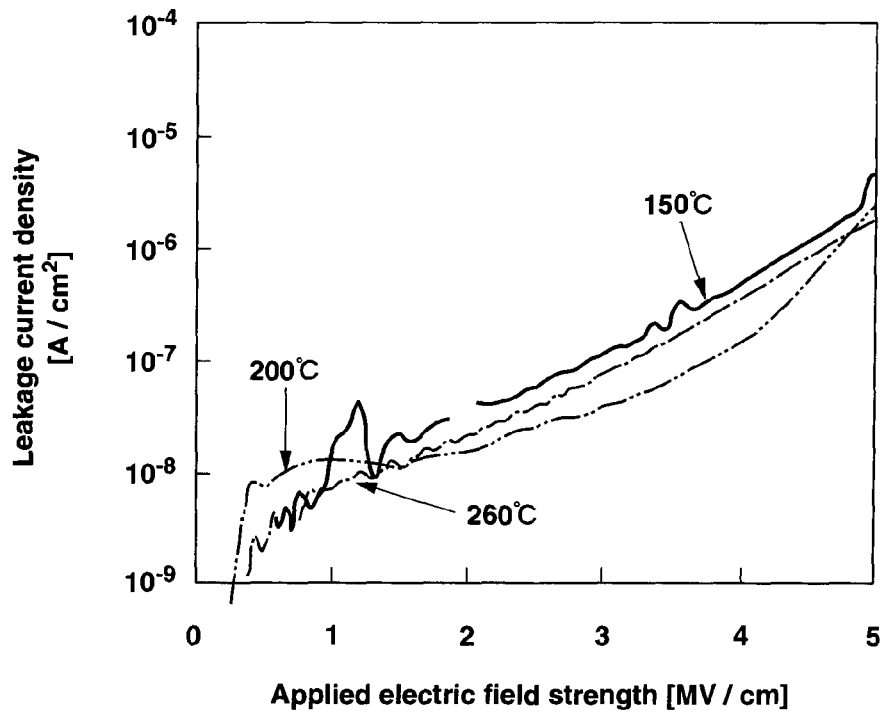
FIG. 10 is a characteristic graph representing insulation characteristics of oxide films formed at film formation temperatures of 260° C., 200° C., and 150° C. at luminance of ultraviolet light of 300 mW/cm².

In addition, FIG. 9 shows characteristic graphs representing insulation characteristics of oxide film formed with a combination use of ultraviolet light of the luminance of 100 mW/cm$^2$ and the luminance of 300 mW/cm$^2$ and insulation characteristics of oxide film formed with no combination use of ultraviolet light. FIG. 10 shows characteristic graphs representing oxide film formed at the film formation temperatures of 260° C., 200° C., and 150° C. with ultraviolet light having the luminance of 300 mW/cm$^2$. As appreciated from these characteristic graphs, it can be verified that the insulation characteristic of oxide film is remarkably improved by a combination use of ultraviolet light and the insulation characteristic is not largely degraded even under the low temperature up to 150° C.

As described above, a utilization efficiency of the starting gas according to the oxide film formation process in this embodiment can be increased and oxide film having a superior electrical characteristic can be formed in the formation process at a temperature equal to or lower than 200° C.

Second Embodiment

Figure 11:
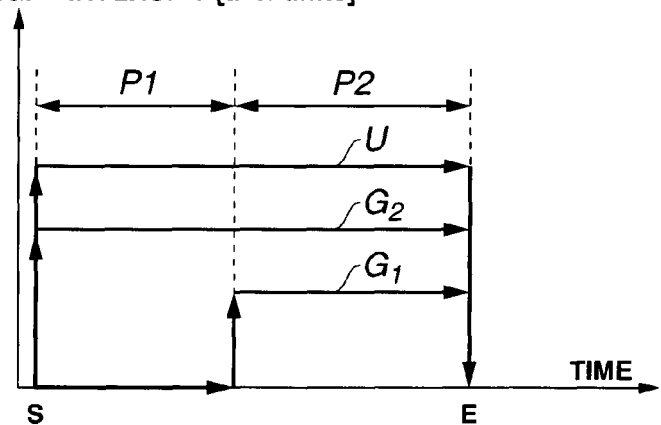
FIG. 11 is a timing chart related to a second preferred embodiment (U: ultraviolet light intensity, $G_2$: ozone gas flow quantity, $G_1$: starting gas flow quantity, S: process start, E: process end).

FIG. 11 shows a timing chart related to a second preferred embodiment (U: ultraviolet light intensity, $G_2$: ozone gas flow quantity, $G_1$: starting gas flow quantity, S: process start, E: process end).

In the first embodiment, the process in which the timings of supply of the starting gas, supply of the ozone gas, the start and end of irradiation of ultraviolet light are arranged properly in order. On the other hand, in this embodiment, only the timing at which the starting gas is introduced is delayed. That is to say, the process in the second embodiment includes a process P1 (a thermal oxidation process of an ozone light interface thermal oxidation) at which only the irradiation of ultraviolet light and the supply of ozone gas are carried out during the start of the whole process and a process P2 (an ozone light CVD process) at which the irradiation of ultraviolet light and the supplies of the ozone gas and the starting gas are performed.

While the starting gas is introduced, the ozone gas is excited through ultraviolet light. Then, the thermal oxidation takes place according to the excited state oxygen atoms generated thereby. The excited state oxygen atoms have a strong oxidation force as compared with ground state oxygen atoms decomposed and generated from ozone molecules. Specially, a saturated binding is also broken as well as a carbon unsaturated binding so that a gasification as $H_2O$ and $CO_2$ and a cleaning of the surface is performed (Moon et al, J. Vac. Sci. Technol. A17, 150-154 (1999)).

Figure 12:
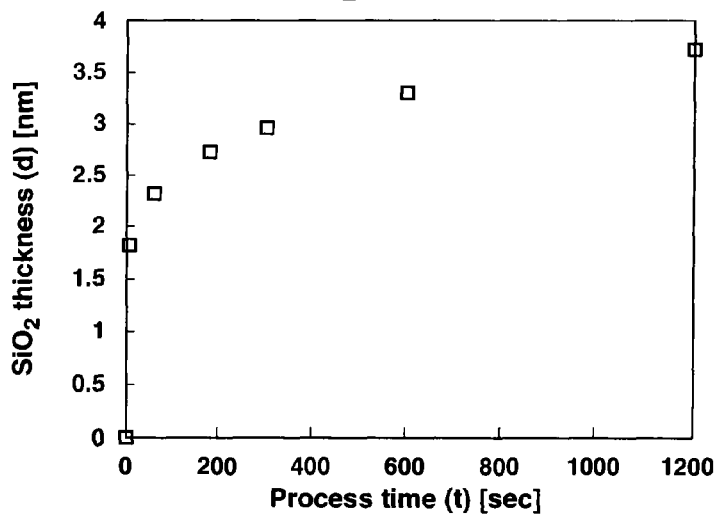
FIG. 12 is a characteristic graph representing an oxidation speed of a thermal oxidation of a substrate composed of a substrate made of a hydrogen terminated Si(100) when no starting gas is introduced.

FIG. 12 shows a characteristic graph representing an oxidation speed of the thermal oxidation of the substrate made of a hydrogen terminated Si(100) when the starting gas is not introduced. The substrate temperature was 200° C., the ozone gas flow quantity was 100 sccm, the process pressure was 50 Pa, the luminance of a range from 210 to 300 nm was 400 mW/cm$^2$. As appreciated from this characteristic graph, for example, in a case of the light luminance of 400 mW/cm$^2$, the thermal oxide film of 3 nm can be prepared for about 6 minutes. This thermal oxide film which was superior in the interface characteristic was verified that it has an interface level density equal to or lower than $1\times10^{11}$ [cm$^{-2}$/eV] as-grown, a fixed charge density of about $1\times10^{11}$ [cm$^{-2}$] or lower, a high insulation withstanding voltage of about 10 [MV/cm], a low leakage current density during a low electric field, and an etch resistance (high density) equivalent to the thermal oxide film formed at high temperature.

As described above, the thermal oxidation is previously carried out before the CVD process of the first embodiment. Thus, the cleaning of the surface of the substrate is achieved. In addition, by previously preparing an $SiO_2$/Si interface into an inside of the substrate, it can be prevented that the accumulation is continued with particles left in the pipe arrangements and the furnace and impurities generated due to the starting gas left on $SiO_2$/Si interface at the timing at which the CVD process is started.

Third Embodiment

In addition, in order to reduce a hygroscopy of oxide film, to improve an adhesion of oxide film to a gate electrode made of MoW and so forth prepared on this insulation film after the process of the film formation, and to prevent a metallic diffusion and mixing onto $SiO_2$ film, the supply of the starting gas is stopped at a final process of processes described in the first embodiment or in the second embodiment and a light ozone thermal oxide film having a high density than the CVD film is generated on the surface of substrate 7. Thus, a favorable interface barrier with a metallic electrode such as the gate electrode is formed. In the same way as the interface thermal oxide film in the second embodiment, the CVD film of an approximately surface 3 nm and which can provide a high density CVD film can be reformed for the process of several minutes.

Figure 3:
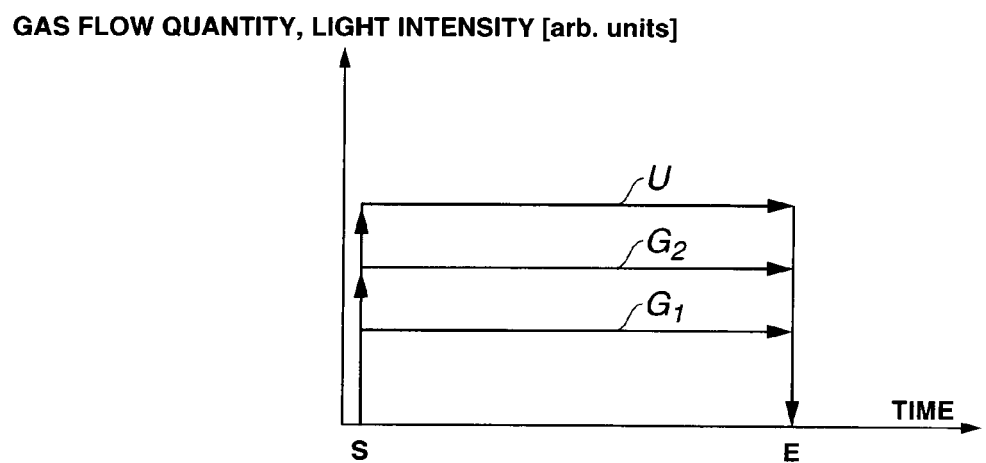
FIG. 3 is a timing chart related to the first embodiment (U: ultraviolet light intensity, $G_2$: ozone gas flow quantity, $G_1$: starting gas flow quantity, S: process start, E: process end).
Figure 13:
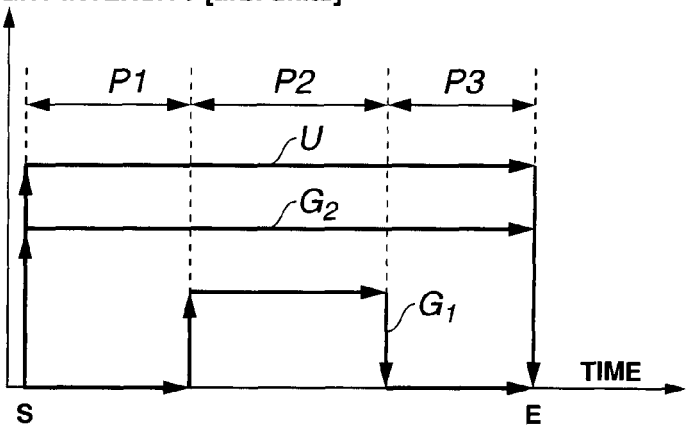
FIG. 13 is a timing chart related to a third preferred embodiment (U: ultraviolet light intensity, $G_2$: ozone gas flow quantity, $G_1$: starting gas flow quantity, S: process start, E: process end).

A timing chart (U: ultraviolet light intensity, $G_2$: ozone gas flow quantity, $G_1$: starting gas flow quantity, S: process start, E: process end) shown in FIG. 13 further includes a process P3 (an ozone light interface thermal oxide process) in which the supply of the starting gas is stopped before the supply of the ozone gas is stopped in the process in which the formation of oxide film is ended in the timing chart of the second embodiment. It should be noted that process P3 may be included in the timing chart shown in FIG. 3 of the first embodiment.

Fourth Embodiment

Furthermore, in the processes described in the second embodiment and in the third embodiment, the light luminance or the light spectrum (a relationship of the intensity between wavelengths emitting the brilliant lines) may be varied. For example, a control of the light luminance may be carried out through a well known optical filter. A control of the light spectrum may be carried out through the control of DC voltage applied across electrodes of the UV lamp. This method can be applied to, for example, the following case which will be described below.

Figure 14:
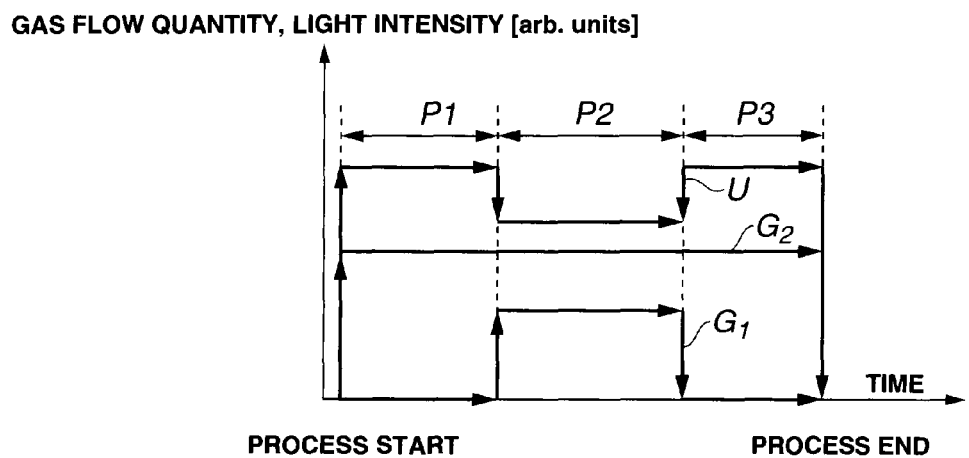
FIG. 14 is a timing chart related to a fourth preferred embodiment (U: ultraviolet light intensity, $G_2$: ozone gas flow quantity, $G_1$: starting gas flow quantity, S: process start, E: process end).

Different kinds of the starting gas are not decomposed to sufficient intermediate products through the ozone gas. Especially, it may occur that the intermediate products (generated in the gaseous phase at room temperature of the ozone and the starting gas) are absorbed in a larger absorption cross sectional area than the photo absorption of ozone in a shorter wavelength side (for example, 210 nm~250 nm) of the ultraviolet light range. In this case, the intermediate products are absorbed and consumed at an upstream side of the flow of gas and a concentration of the intermediate products at the downstream side is reduced. It becomes difficult to perform the uniform process of the film thickness and the film quality. Therefore, it is effective to weaken luminance of light at a shorter wavelength side in the process of the light ozone CVD process in the fourth embodiment. For example, as in a timing chart shown in FIG. 14 (U: ultraviolet light intensity, $G_2$: ozone gas flow quantity, $G_1$: starting gas flow quantity, S: process start, E: process end), the luminance of ultraviolet light is decreased so that the film formation speed during process P2 is reduced. Thus, the film quality is improved and a throughput of preparing a surface protection film during an interface thermal oxidation with the groundwork is also improved.

Fifth Embodiment

Figure 15:
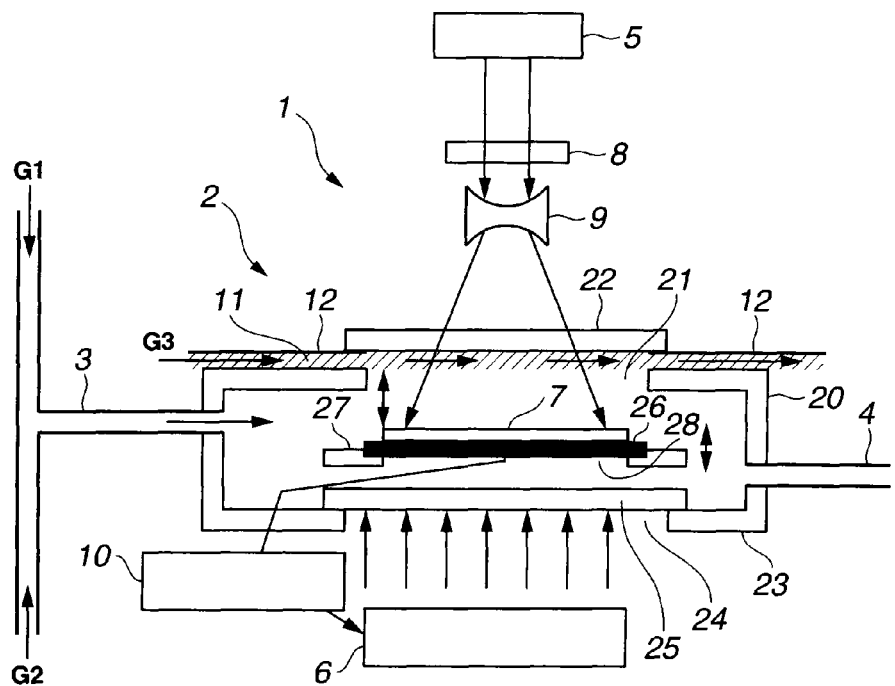
FIG. 15 is a rough configuration view of oxide film formation apparatus related to a fifth preferred embodiment.

FIG. 15 shows a rough configuration view of the oxide film formation apparatus in a fifth preferred embodiment.

Oxide film formation apparatus 1 in this embodiment is formed with a gas layer 11 in which an inert gas $G_3$ is circulated between light introduction plate 22 and an opening 21 of treatment furnace 2, in the oxide film formation apparatus in each of the first through fourth embodiments, in order to prevent a reduction of the luminance of light according to the accumulation of the reaction products during the CVD process onto light introduction plate 22. According to oxide film formation apparatus 1 in this embodiment, an adhesion of the particles and so forth onto light introduction plate 22 can be prevented, a reduction of an aging effective luminance, a reduction of an effective luminance, a reduction of the film formation speed due to unevenness of the luminance and a generation of an evenness of film formation speed can be suppressed.

Oxide film formation apparatus 1 is installed for light introduction plate 22 to be spaced apart from and in parallel to an upper surface of ceiling section 20 of treatment furnace 2. Gas layer 11 is formed for a terminal portion at an upper stream side of light introduction plate 22 and for a terminal portion at a downstream side thereof connected to a guide plate 12. Guide plate 12 is so arranged so as to be in parallel to an upper surface of ceiling portion 20 of treatment furnace 2. As inert gas G3, a gas having a small reaction speed constant to the excited state oxygen atoms as compared with a reaction speed constant together with the oxygen and the excited state oxygen atoms, namely, a gas in which a reaction to the oxygen gas in the excited state oxygen atoms occurs and the deactivation to the base ground state oxygen atoms does not occur is desirable. For example, this gas includes Ar gas or He gas.

As appreciated from the above explanations, the utilization efficiency of the starting gas is increased according to the oxide film formation apparatus in the first through fifth embodiments and the oxide film having a superior electric characteristic in the film formation process of 200° C. or lower can be formed. In addition, the wavelength of ultraviolet light is limited to be longer than 20 nm which does not induce the light damage on the substrate, the light image onto the groundwork substrate such as glass can largely be reduced. Furthermore, since the absorption of ultraviolet light using the starting gas is small, only the excited state oxygen atoms generated due to an interaction between the ozone and the light selectively reacts with the starting gas, and the gas phase reaction and the surface reaction are advanced, the film thickness distribution is determined only according to the irradiation of the light. Hence, an introduction of the gas, the discussion of the stream, the discussion of the substrate, and a mechanism of a rotation of the substrate that are conventionally required can be simplified.

In addition, treatment furnace 2 is a furnace of a cold wall type, a temperature of substrate 7 stored in the furnace is low as 200° C., the excited state oxygen atoms are generated according to the light absorption by ozone, and, furthermore, the light is irradiated onto the surface of substrate 7. Thus, the surface of substrate 7 and gas temperature are locally raised and a frequency of the gas phase reaction in the process becomes extremely low as compared with the frequency of the surface reaction of substrate 7. Thus, the film formation at a location except the surface of substrate 7 is reduced. Consequently, a high-speed film formation with a small amount of starting gas can be achieved. That is to say, the utilization efficiency of gas can be increased. That is to say, a utilization rate of the starting gas becomes high so that the load onto an exhaust pump is reduced.

Furthermore, the ozone gas and the starting gas are mixed at room temperature and the ozone gas flow quantity is supplied by a sufficient quantity as compared with the starting gas (for example, twice as the molecular number of the ozone necessary for oxidizing the starting gas stoichiometrically). At this time, an extra ozone gas and the intermediate products (Si—O, $CO_2$, $H_2O$, and so forth) are produced. The absorption of ultraviolet light is not present other than the extra ozone gas. Intermediate bodies are not furthermore decomposed up to atom states (for example, oxygen atoms and hydrogen atoms). These impurities becomes difficult to be taken into the film and exhausted in the gaseous state. In addition, since the intermediate products are not decomposed, the concentration of the excited state oxygen atoms generated as a result of the light absorption reaction of the extra ozone is sufficiently low as compared with each of the ozone concentration and the concentration of the intermediate products. Thus, even the intermediate product concentration and the excited state oxygen concentration at a downstream side of the gas flow approximately equal to those at the upstream side thereof are realized. In addition, an uniform film formation speed at the upstream side of the gas flow and at the downstream side of the gas flow are achieved.

Especially, according to the oxide film formation apparatus in each of the second, third, and fourth embodiments, a plurality of furnaces are not needed to be installed. A single treatment furnace achieves the interface oxidation (an interface cleaning) and the surface oxidation (surface deformation). That is to say, the throughput is increased and a film formation cost is reduced.

In addition, according to the oxide film formation apparatus in the fourth embodiment, optimum light luminance and light spectrum which achieves the increase in the throughput and the optimization of the film quality to meet with the process of the ozone light interface thermal oxidation and the process of the ozone surface thermal oxidation are achieved by means of a single light source.

Furthermore, according to the oxide film formation apparatus in the fifth embodiment, the adhesion of the particles onto the ultraviolet light transmitting window is prevented, the reduction of an aging effective luminance, the reduction of the film formation speed due to the unevenness in the luminance, and the generation of unevenness of the film formation are suppressed.

The invention claimed is:

1. A method for oxide film formation comprising:
   irradiating light in an ultraviolet light range on a substrate; and
   supplying a mixture of a starting gas of an organosilicon and an ozone gas to the substrate to form an oxide film on a surface of the substrate,
   wherein the ozone gas is mixed with the starting gas at room temperature and a mixture quantity of the ozone gas with the starting gas is set to be equal to a chemical equivalent or more for totally oxidizing the starting gas.

2. The method for oxide film formation as claimed in claim 1, wherein the irradiating light has a wavelength longer than 210 nm.

3. The method for oxide film formation as claimed in claim 1, further comprising, before supplying the mixture to the substrate, supplying the ozone gas without the starting gas to the substrate.

4. The method for oxide film formation as claimed in claim 3, wherein, in a process in which oxide film formation is ended, a stop of the supply of the starting gas is made before a stop of the supply of the ozone gas.

5. The method for oxide film formation as claimed in claim 3, wherein, in a process in which the supply of organosilicon material is made, an intensity of light in the ultraviolet light range is reduced.

6. The method for oxide film formation as claimed in claim 1, wherein light in the ultraviolet light range is irradiated onto the substrate via a gas layer through which an inert gas is circulated.

7. An apparatus for oxide film formation, the apparatus comprising:
   a treatment furnace;
   a substrate located inside the treatment furnace;
   a light source configured to irradiate light in an ultraviolet light range on the substrate in the treatment furnace;
   a pipe arrangement configured to mix and supply a starting gas of an organosilicon and an ozone gas at room temperature to form an oxide film on the substrate,
   wherein a mixture quantity of the ozone gas with the starting gas is set to be equal to a chemical equivalent or more for totally oxidizing the starting gas.

8. The apparatus for oxide film formation as claimed in claim 7, wherein the irradiating light has a wavelength longer than 210 nm.

9. The apparatus for oxide film formation as claimed in claim 7, further comprising:
   a light introducing section configured to introduce the light in the ultraviolet light range,
   a gas layer through which an inert gas is circulated between the light introducing section and the treatment furnace such that the light in the ultraviolet light range is irradiated onto the substrate via the gas layer.

10. The method as claimed in claim 1, wherein the ozone gas and the starting gas are mixed with each other before being introduced into a furnace storing the substrate.

11. The method as claimed in claim 1, wherein, when the substrate is irradiated with the light in the ultraviolet light range, the mixture of the ozone gas and the starting gas of organosilicon which exist on the surface of the substrate is irradiated to form the oxide film.

12. A method for oxide film formation comprising:
   providing a starting gas of an organosilicon;
   providing an ozone gas;
   mixing the starting gas and the ozone gas at room temperature, in quantities equal to a chemical equivalent or more for totally oxidizing the starting gas, to form a mixture;
   holding the mixture at room temperature for a period of time sufficient to allow the mixture to come to a substantially stable intermediate state;
   supplying the starting gas and the ozone gas to a substrate; and
   irradiating light in an ultraviolet light range on the substrate.

* * * * *